US011079820B2

(12) United States Patent
Scott, III

(10) Patent No.: US 11,079,820 B2
(45) Date of Patent: Aug. 3, 2021

(54) METHOD AND APPARATUS FOR IMPROVING REMOVABLE STORAGE PERFORMANCE

(71) Applicant: Microsoft Technology Licensing, LLC, Redmond, WA (US)

(72) Inventor: George Easton Scott, III, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 31 days.

(21) Appl. No.: 16/248,139

(22) Filed: Jan. 15, 2019

(65) Prior Publication Data

US 2020/0225719 A1 Jul. 16, 2020

(51) Int. Cl.
    *G06F 1/20* (2006.01)
    *G06F 11/30* (2006.01)
    *G06K 7/00* (2006.01)

(52) U.S. Cl.
    CPC .......... *G06F 1/206* (2013.01); *G06F 11/3037* (2013.01); *G06F 11/3058* (2013.01); *G06K 7/0017* (2013.01); *G06F 2201/81* (2013.01)

(58) Field of Classification Search
    CPC .. G06F 1/206; G06F 11/3037; G06F 11/3058; G06F 2201/81; G06K 7/0017
    See application file for complete search history.

(56) References Cited

U.S. PATENT DOCUMENTS

| 5,930,738 | A | * | 7/1999 | Jones | ............. G06F 9/4401 702/132 |
| 6,003,068 | A | | 12/1999 | Sopko | |
| 6,424,532 | B2 | | 7/2002 | Kawamura | |
| 6,786,639 | B2 | | 9/2004 | Covi et al. | |
| 7,296,345 | B1 | | 11/2007 | Wang et al. | |
| 7,555,411 | B2 | | 6/2009 | Wang et al. | |
| 8,030,719 | B2 | | 10/2011 | Li et al. | |

(Continued)

FOREIGN PATENT DOCUMENTS

| EP | 1591949 A2 | 11/2005 |
| EP | 2317460 A1 | 5/2011 |
| WO | 2017123221 A1 | 7/2017 |

OTHER PUBLICATIONS

"International Search Report and Written Opinion Issued in PCT Application No. PCT/US20/012282", dated Mar. 18, 2020, 14 Pages.

(Continued)

*Primary Examiner* — Chad G Erdman

(57) ABSTRACT

The present disclosure relates to methods and devices for operation of a removable storage device. In some aspects, the device can initialize the operation of a removable storage device, such as with a host device. The device can also identify an environment around the device as a thermally enhanced environment or a thermally non-enhanced environment in response to the initialization of operation of the device. Additionally, the device can select a thermal control loop algorithm of the removable storage device based on the identified environment. The device can also adjust a thermal control loop algorithm of the device based on the identified environment. Moreover, the device can control processing operations of a processor in response to the adjusted thermal control loop algorithm.

20 Claims, 8 Drawing Sheets

(56) References Cited

U.S. PATENT DOCUMENTS

| | | | |
|---|---|---|---|
| 8,167,643 | B2 | 5/2012 | Yoshida et al. |
| 8,182,139 | B2 | 5/2012 | Fiennes et al. |
| 8,385,083 | B2 | 2/2013 | Chan |
| 8,599,559 | B1 | 12/2013 | Morrison et al. |
| 9,488,529 | B2 | 11/2016 | Hong et al. |
| 10,205,277 | B2 | 2/2019 | Kimura et al. |
| 10,372,168 | B1* | 8/2019 | He .................. G06F 1/20 |
| 2007/0027580 | A1 | 2/2007 | Ligtenberg et al. |
| 2007/0067136 | A1* | 3/2007 | Conroy ............ G06F 1/206 702/130 |
| 2007/0274046 | A1 | 11/2007 | Choi et al. |
| 2008/0025003 | A1 | 1/2008 | Nishizawa et al. |
| 2010/0022113 | A1 | 1/2010 | Ito |
| 2010/0194321 | A1* | 8/2010 | Artman ............ F04D 27/004 318/454 |
| 2011/0103027 | A1 | 5/2011 | Aoki et al. |
| 2011/0166828 | A1* | 7/2011 | Steinberg ......... G05B 13/048 702/182 |
| 2011/0213508 | A1* | 9/2011 | Mandagere ........ G06F 1/26 700/291 |
| 2011/0301777 | A1* | 12/2011 | Cox ................ G06F 1/206 700/299 |
| 2013/0183862 | A1 | 7/2013 | Ni et al. |
| 2013/0295792 | A1 | 11/2013 | Naito et al. |
| 2014/0006818 | A1* | 1/2014 | Doshi ............. G06F 1/206 713/320 |
| 2014/0019418 | A1 | 1/2014 | Chu et al. |
| 2014/0148046 | A1 | 5/2014 | Naito et al. |
| 2014/0281609 | A1* | 9/2014 | Hanumaiah ....... G06F 1/3296 713/320 |
| 2015/0134123 | A1* | 5/2015 | Obinelo ........... F24F 11/30 700/277 |
| 2016/0292959 | A1* | 10/2016 | Salzman .......... G07F 17/3223 |
| 2017/0150645 | A1 | 5/2017 | Huang et al. |
| 2017/0256143 | A1* | 9/2017 | Montero .......... G06F 11/326 |
| 2018/0349243 | A1 | 12/2018 | Shin et al. |
| 2018/0350410 | A1 | 12/2018 | Curtis et al. |
| 2019/0273340 | A1 | 9/2019 | D'inca et al. |
| 2019/0339888 | A1* | 11/2019 | Sasidharan ....... G06F 13/4282 |
| 2020/0015385 | A1 | 1/2020 | Bucher |
| 2020/0077541 | A1 | 3/2020 | Sharf |
| 2020/0137922 | A1 | 4/2020 | Iino et al. |
| 2021/0026328 | A1 | 1/2021 | Lau et al. |
| 2021/0026414 | A1 | 1/2021 | Lau et al. |

OTHER PUBLICATIONS

Aqib, Muhammad, "How to Make an Arduino SD Card Data Logger for Temperature Sensor Data", Retrieved from: https://maker.pro/arduino/tutorial/how-to-make-an-arduino-sd-card-data-logger-for-temperature-sensor-data, Jul. 15, 2018, 14 Pages.

Hamza, Ali, "Use an Arduino to make a data logger to collect temperature, humidity, and heat data", Retrieved from: https://maker.pro/arduino/tutorial/how-to-log-temperature-humidity-heat-data-with-arduino-to-sd-card, Mar. 21, 2018, 15 Pages.

"International Search Report and Written Opinion Issued in PCT Application No. PCT/US20/036546", dated Sep. 8, 2020, 15 Pages.

"International Search Report and Written Opinion Issued in PCT Application No. PCT/US20/036721", dated Sep. 22, 2020, 18 Pages.

"Non Final Office Action Issued in U.S. Appl. No. 16/522,503", dated Jan. 1, 2021, 15 Pages.

"Final Office Action Issued in U.S. Appl. No. 16/522,503", dated Mar. 23, 2021, 18 Pages.

* cited by examiner

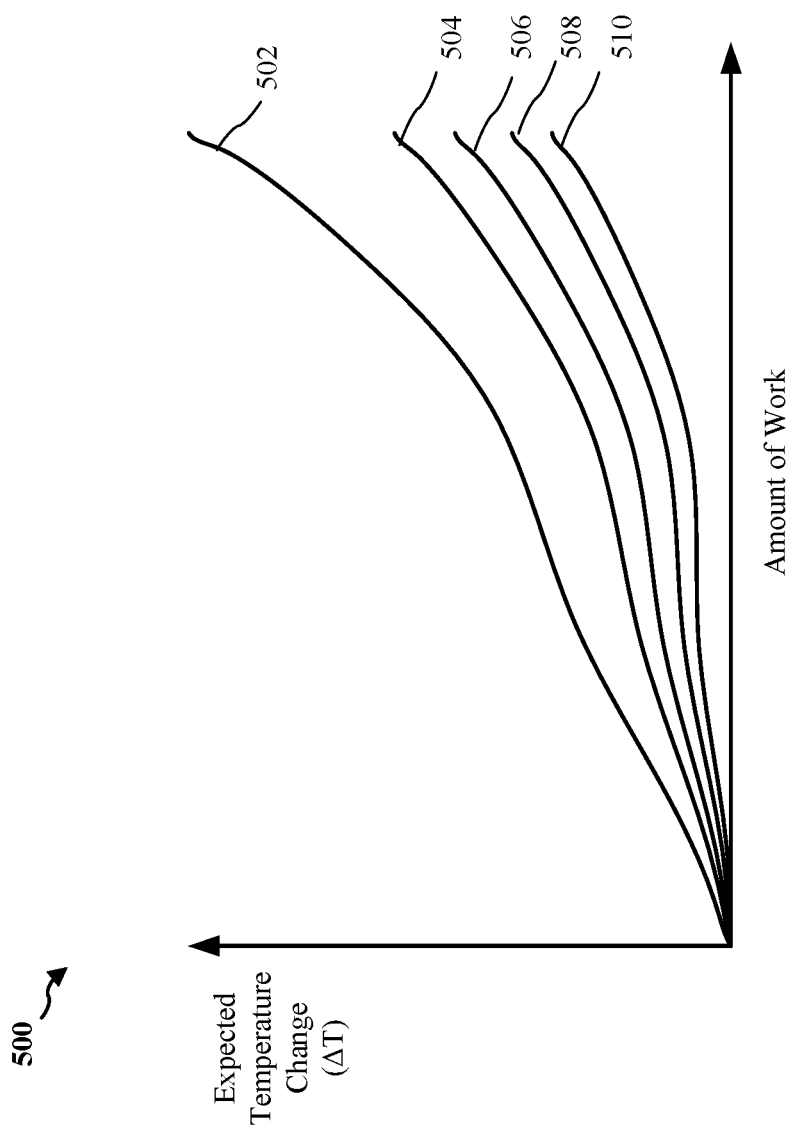

METHOD AND APPARATUS FOR IMPROVING REMOVABLE STORAGE PERFORMANCE

BACKGROUND

The present disclosure relates generally to storage systems and, more particularly, to one or more methods or apparatus for improving removable storage card performance.

Some electronic devices, e.g., gaming systems, computers, tablets, and mobile phones, can have limited internal memory for storing files. To compensate for the limited internal memory, such devices can provide for expanding the storage capacity of the device through the use external, removable memory cards, including but not limited to secure digital (SD) memory cards, micro SD cards, or compact flash (CF) memory cards. Although external memory cards can significantly increase the storage capacity of an electronic device, their performance can be limited by heat. An external memory card can increase in temperature through its own performance and/or any heat contributed from the electronic device in which it is inserted. If an external memory card increases in temperature by too great of an amount, it can negatively affect the performance of the memory card and/or the electronic device in which it is inserted.

As a result of an increase in speed and performance of electronic devices that utilize external storage devices, e.g., computers and gaming systems, there has developed a need for improved external storage devices.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be a removable storage device. The apparatus can include a memory configured to store instructions and a processor in communication with the memory. The apparatus can identify an environment around the device as a thermally enhanced environment or a thermally non-enhanced environment in response to an initialization of operation of the device. The apparatus can also adjust a thermal control loop algorithm of the device based on the identified environment. Further, the apparatus can control processing operations of the processor in response to the adjusted thermal control loop algorithm.

In another aspect of the disclosure, a method, a computer-readable medium, and an apparatus are provided. The apparatus may be a host device. The apparatus can include a housing having an internal wall defining a through hole, wherein the housing can include at least a removable memory card environment and a separate additional component environment. The apparatus can also include a removable memory card interface mounted within the removable memory card environment and can have a slot aligned with the through hole. The apparatus can also include a removable storage card removably positionable within the slot and contactable with a thermal interface member. The removable storage card can include a processor executable to identify the removable memory card environment as a thermally enhanced environment or a thermally non-enhanced environment in response to an initialization of operation of the card. The processor can also adjust a thermal control loop algorithm of the card based on the identified environment. Also, the processor can control processing operations in response to the adjusted thermal control loop algorithm.

In another aspect of the disclosure, a method, a computer-readable medium, and an apparatus are provided. The apparatus may be a removable storage device. The apparatus can initialize the operation of a removable storage device, such as with a host device. The apparatus can also identify an environment around the device as a thermally enhanced environment or a thermally non-enhanced environment in response to the initialization of operation of the device. Additionally, the apparatus can select a thermal control loop algorithm of the removable storage device based on the identified environment. The apparatus can also adjust a thermal control loop algorithm of the device based on the identified environment. Moreover, the apparatus can control processing operations of a processor in response to the adjusted thermal control loop algorithm.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIG. 5 is a graph of different example curves for different removable storage device environments of expected temperature change versus an amount of work (e.g., read, write) performed by the removable storage device, in accordance with one or more techniques of this disclosure.

DETAILED DESCRIPTION

Figure 1:
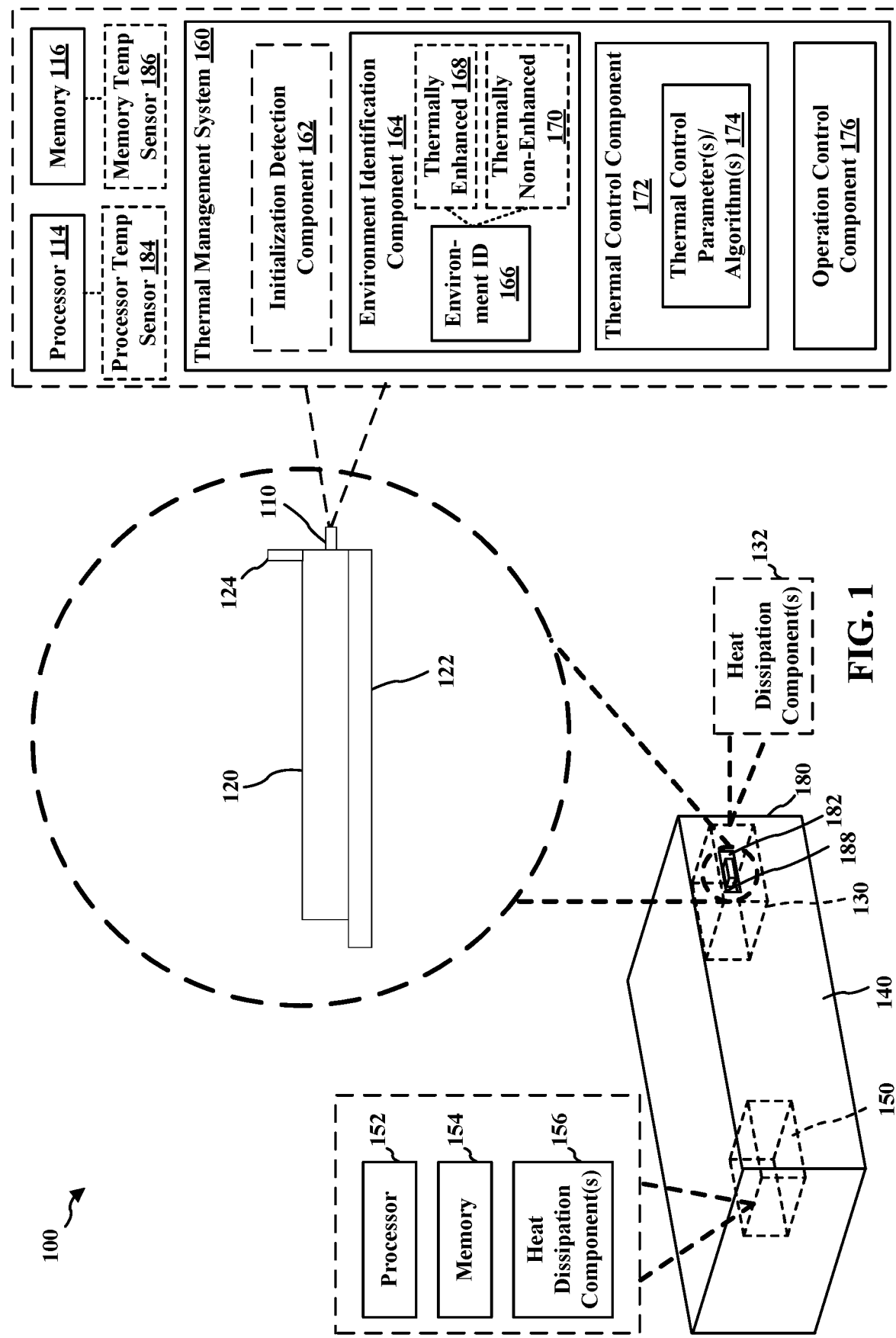
FIG. 1 is a schematic diagram of an example computer memory storage system in accordance with one or more techniques of this disclosure.

Various aspects of systems, apparatuses, computer program products, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of this disclosure to those skilled in the art. Based on the teachings herein one skilled in the art should appreciate that the scope of this disclosure is intended to cover any aspect of the systems, apparatuses, computer program products, and methods disclosed herein, whether implemented independently of, or combined with, other aspects of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. Any aspect disclosed herein may be embodied by one or more elements of a claim.

Removable storage devices or external memory cards can help to increase the storage or memory capacity of electronic devices. The performance of a memory card or removable storage card, e.g., a flash or non-volatile memory based removable storage card, can be limited by the thermal environment or surroundings in which it is operating. In some aspects, a thermal management system of the memory card may make pessimistic assumptions regarding the surrounding environment, such that the card thermal operating limits are not exceeded. Such operating limits may include, for example, the processor (e.g., an application specific integrated circuit (ASIC)) and/or a memory (e.g., NAND-type flash) and/or a card thermal operating threshold. The pessimistic assumptions can result in performance rate limiting, i.e., "throttling," before thermal operating limits are reached. For example, memory cards can perform thermal throttling, i.e., limiting the performance of the card and corresponding thermal output, in instances when an expected amount of heat produced by the card may not be dissipated into the surrounding environment quickly enough to avoid a predicted operating temperature from exceeding a thermal threshold.

In some instances, a memory card may include a thermal management system or thermal control loop that may assume a typical operating environment. In these instances, a memory card may start throttling sooner than necessary, for example, in cases where the operating environment include enhanced thermal features to improve dissipation of heat. Further, limits in the speed of reading a flash die temperature, as well as inaccuracies of the resulting value, may force the thermal management system or thermal control loop to make overly conservative assumptions regarding the thermal characteristics of the surrounding environment. These assumptions can result in thermal throttling well before the actual thermal limit of the memory card is reached.

In some aspects, memory cards can receive an instantaneous maximum work request from the device in which the card is inserted. If the memory card is already near its self-imposed thermal limit, it must defer servicing this work request in order to not exceed the thermal limit. As disclosed in the present aspects, however, if the memory card has precise information about the surrounding thermal environment, it may understand that the extra thermal work load can be dissipated by the surrounding environment. Accordingly, the memory card can accept the work request and even allow for future work requests to continue. As such, it can be advantageous for memory cards or removable storage devices to be able to account for the heat dissipation characteristics of the surrounding environment.

Removable storage devices or memory cards, e.g., SD cards, micro SD cards, or CF cards, are typically low performance devices that may not require much power to function. As previous removable storage cards have worked primarily in low performance environments, there has not been much of a need for high performance storage cards. However, with the advent of high performance devices and environments, memory cards have an increased need to function as high performance devices, such as when being inserted into a high performance environment. In some aspects, if a low power memory card is inserted in a high power environment, it may not live up to the potential of the surrounding environment. Accordingly, it may be beneficial to both the memory cards and the surrounding environment if memory cards are able to fully process and appreciate a high performance environment. As disclosed herein, for instance, if memory cards are in a high performance environment, it can be beneficial to determine the precise working environment, in order to enable the memory cards to run at an increased performance and/or temperature in response to being activated or installed in the environment.

Prior to the present solution, some relatively high performance removable storage cards, such as certain SD, micro SD, or CF memory cards, can make certain assumptions about the thermal environment in which they operate and the thermal effects of corresponding work (e.g., reads, writes). In some instances, these assumptions may be pessimistic in that they assume a typical thermal environment, where additional heat removing features are not present, such that the assumptions may limit performance of the memory card by incorrectly determining the thermal effect of the work. In some aspects, the work load of memory cards may have a dynamic nature. For example, if a high performance card is operating in an unknown or low performance environment, the card may increase the amount of work slowly in order to not overshoot the critical temperature. In these aspects, the card may take a long time to reach a final operating temperature, e.g., just below the critical temperature, as well as perform less work per unit time compared to a high performance card operating in a high performance environment.

According to the present disclosure, however, if a memory card can detect its surrounding environment, rather than making assumptions, then the imprecise assumptions of prior solutions can be replaced with precise, known values for use in determining the thermal effect of the work. Accordingly, memory cards can improve performance through a more thorough understanding of the surrounding environment.

In one example implementation, the present disclosure provides for memory cards that can detect the surrounding environment and/or device in which the memory card is inserted and adjust thermal controls accordingly. For example, upon initialization (e.g., insertion into a host device), memory cards according to the present disclosure can receive a signal indicating the type of surrounding environment. In response, memory cards according to the present disclosure can select or otherwise determine corresponding thermal control parameters and/or corresponding thermal control algorithms, from a plurality of different thermal control parameters and/or a plurality of different thermal control algorithms that are each associated with different operating environments that have different heat dissipation characteristics. For instance, in one implementation, the signal may indicate either a thermally enhanced environment or a thermally non-enhanced environment, where such an environment is defined by the area within or on the host device immediately adjacent to and/or surrounding the memory card. The thermally enhanced environment may include one or more features designed to remove heat specifically from the local environment of the memory card. In contrast, the thermally non-enhanced environment is absent any such features the local environment of the memory card to specifically remove heat generated by the memory card. In some implementations, there may be a plurality of different thermally enhanced environments, for instance based on the number, type, or current state (e.g., on or off) of thermal dissipation components present in the local environment of the memory card. Such thermal dissipation components may include, for example, a fan specifically configured to cool the local environment of the memory card, and/or other components that provide a thermal path out of the memory card. In any case, based on the detected environment of the memory card, the memory card can adjust thermal control parameters and/or algorithms to correspond with the thermal characteristics of the environment, and thereby provide more environment-specific thermal control over the work performed by the memory card.

In some implementations, according to an additional aspect, the memory card of the present disclosure may measure the temperature of memory card components (e.g., the processor and/or the memory) and/or of the environment and use such measurements to further adjust the thermal control parameters and/or algorithms. Further, memory cards herein can also monitor and store such temperature measurements over a time period to determine how the thermal environment changes, which can either increase or decrease performance, and in response periodically adjust the thermal control parameters and/or algorithms based on the monitored performance.

Additionally, in an implementation, the present disclosure includes a surrounding environment or host device, such as one in which a memory card is inserted, which communicates information about the environment of the memory card to the memory card. In this manner, a memory card can obtain thermal information from the environment or device in which it is inserted. The surrounding environment or device can also inform the memory card of various thermal limits of the environment, e.g., a thermal limit at which a cooling device is enabled, thermal time constants, etc. For example, a card socket or card slot in which a memory card is inserted can include a communicate interface with the card to carrying signaling of information about the environment.

Additionally, certain components of the surrounding environment or host device, e.g., a card slot or chassis of the device, can assist with the thermal environment sensing and/or dissipation of heat from the memory card. Thus, according to the present disclosure, upon initialization in a host device, memory cards or removable storage devices can better understand the environment in which they are working, and adjust thermal controls parameters and/or algorithms accordingly.

Referring to FIG. 1, an example computer memory storage system 100 includes a memory card 110 having a thermal management system that operates, upon initialization (e.g., insertion into) a host device 140, to adjust thermal control parameters and/or algorithms in response to an identified surrounding environment 130, thereby improving the performance of the memory card 110. System 100 includes memory card 110, which may include a protective memory card shell 112, which is removably insertable into a card slot or socket 120. The card slot 120 provides a communication interface between the memory card 110 and the host device 140, for example, through engagement of corresponding electrical contacts. The card slot 120 may be mounted on a connector base 122, and may further include a connector tab 124 for use in mounting the card slot 120 within a housing, e.g., to a chassis 188, of the host device 140.

In some aspects, memory card shell 112 can be a metallic or thermally conductive material in order to dissipate heat from the card. Card slot 120 can also comprise a metallic or thermally conductive material, e.g., copper, which can assist in dissipating heat from the memory card 110 and/or the card slot 120. Connector base 122 can also comprise a metallic or thermally conductive material in order to facilitate heat dissipation.

The surrounding environment 130 can be an area that is around or immediately adjacent to memory card 110, memory card shell 112, card slot or socket 120, connector base 122, or connector tab 124. In particular, the surrounding environment 130 can also be within host device 140, and may be separate or spaced apart from other environments 150 within the host device 140. For example, the surrounding environment 130 may have one or more heat dissipation components 132 specifically designed and/or configured to remove heat from the surrounding environment 130 in order to reduce a temperature of the memory card 110 or its components. In contrast, the separate, other environment 150 may be an area within the host device 140 in which other host device components are mounted, such as but not limited to one or more processors 152, one or more memories 154, and/or one or more heat dissipation components 156 that are specifically configured to remove heat from the other environment 150. In this example, the heat dissipation components 132 and 156 may include a fan and/or any other thermally conductive component capable of drawing out heat from the respective areas.

According to the present solution, memory card 110 utilizes thermal management system 160 to better understand the environment of system 100, e.g., environment 130, and adjust its internal working parameters accordingly. For example, the memory card 110 can receive an environment identification signal that includes environment identification information 166 that indicates a type of the surrounding environment 130, such as a thermally enhanced environment 168 or a thermally non-enhanced environment 170. In some cases, the environment identification information 166 may indicate one of a plurality of different types of thermally enhanced environments 168, e.g., corresponding to a number, type, and/or mode (e.g., on/off) of the heat dissipation components 132 in the surrounding environment 130. The signal may be based on insertion of the memory card 110 into the card slot 120, and/or a signal sent by the host device 140. In an implementation, an environment identification component 164 can read or decode to the environment identification information 166 and identify whether the surrounding environment 130 is the thermally non-enhanced environment 170, e.g., a low performance thermal environment, or the thermally enhanced environments 168, a high performance thermal environment 130.

For example, in some aspects, a thermally enhanced environment 168 type of the surrounding environment 130 can have the ability to remove heat from the area adjacent to the memory card 110 when inserted in the host device 140, which can be accomplished either actively or indirectly. For example, thermally enhanced environment 168 can include a thermal path for heat dissipation, e.g., to dissipate heat from memory card 110. In some instances, this heat dissipation path can be a path from the memory card 110 to another component in the surrounding environment, e.g., card slot 120, connector base 122, connector tab 124, or a chassis 188 of the host device 140. Moreover, thermally enhanced environment 168 can include one or more heat dissipation components 132, such as but not limited to a cooling device, e.g., a cooling fan. In an example, a cooling device can be immediately adjacent to and/or placed in contact with a memory card related component of the host device 140, e.g., card slot 120, connector base 122, connector tab 124, or a chassis 188, which can cool the component and indirectly remove heat from the memory card 110.

In some aspects, the memory card 110 can have one or more thermally conductive elements, such as but not limited to a metal case or shell, e.g., memory card shell 112, which can help to facilitate the heat regulation between the memory card 110 and the thermally enhanced environment 168.

Moreover, these thermally conductive elements of the memory card 110 may also be electrically conductive, which can carry or generate the environment identification signal that includes environment identification information 166. For instance, if there is a contact between the card shell 112 and the thermally enhanced environment 168, e.g., through the card slot 120 in which the memory card 110 is inserted, the memory card 110 can communicate with the surrounding environment 130 and/or the host device 140. For example, the surrounding environment 130, e.g., card slot 120, and/or the host device 140 can inform the memory card 110 that it is operating in the thermally enhanced environment 168 type of the surrounding environment 130.

For example, upon inserting the memory card 110 into the card slot 120, electrical and thermal contact is made, which initiates the communication between the memory card 110 and the surrounding environment 130 and/or the host device 140. For example, if the card shell 112 is grounded or raised to a potential, then the memory card 110 or the environment identification component 164 can detect this contact and can indicate this status to the memory card 110 and/or thermal management system 160. Further, if the memory card 110 is not making contact and the electrical signal or charge is not detected, then the environment identification component 164 can assume it is in the thermally non-enhanced environment 170.

Additionally, once the memory card 110 verifies that it is in either the thermally enhanced environment 168 or the thermally non-enhanced environment 170, it can alter its throttling algorithms to reflect the thermal environment. For example, in an aspect, the memory card 110 can execute a thermal control component 172 to select a set of thermal control parameters and/or a thermal control algorithm 174 from a plurality of different parameters/algorithms corresponding to different identified thermal environment types of the surrounding environment 130. For instance, in response to receiving the indication of the thermally enhanced environment 168, the thermal control component 172 can adjust the settings to more aggressively estimate the dissipation of heat from the surrounding environment 130, as compared to the settings used to estimate the dissipation of heat in response to the thermally non-enhanced environment 170 being detected. For instance, the set of thermal control parameters and/or thermal control algorithm 174 may estimate an amount of change in temperature that is associated per unit work performed by a processor 114 (e.g., an ASIC) and/or a memory 116 (e.g., Not AND (NAND) flash type memory) of the memory card 110, e.g., in performing card reads and/or card writes. As a result, for example, for a same type of work performed, the set of thermal control parameters and/or thermal control algorithm 174 may be set to enable the memory card 110 to perform work at a greater rate for the thermally enhanced environment 168 as compared to the thermally non-enhanced environment 170. In other words, for the same type of work performed, the set of thermal control parameters and/or thermal control algorithm 174 for the thermally enhanced environment 168 estimate a smaller temperature increase and/or a slower climb to a critical temperature threshold as compared to those settings for the thermally non-enhanced environment 170.

Correspondingly, when a request to perform work is received, the memory card 110 can execute an operation control component 176 to communicate with the thermal control component 172 to determine if the work (e.g., a read or write) can be performed without exceeding an operating temperature. Based on this determination, the operation control component 176 can accept or delay the requested work.

Thus, the memory card 110 of this disclosure can dynamically adjust thermal control parameters and/or algorithms to enable the memory card 110 to take on more work per unit of time when operated in the thermally enhanced environment 168.

Additionally, storage system 100 can perform or provide the temperature measurements of the surrounding environment 130. In these instances, memory card 110 can obtain thermal information from the host device 140. The host device 140 can also inform the memory card 110 of various thermal limits of the surrounding environment. For instance, certain components of the storage system 100, e.g., card slot 120, connector base 122, connector tab 124, or a chassis 188, can communicate with the memory card 110. These components of the storage system 100 can also provide information to the memory card 110 about certain thermal levels, e.g., a thermal limit at which a cooling device is enabled, thermal time constants, or any other thermal parameter. Moreover, storage system 100 can enable or enhance the thermal sensing of the surrounding environment 130, such as with certain components, e.g., card slot 120, connector base 122, connector tab 124, or a chassis 188. Based on these characteristics of storage system 100, memory card 110 can better understand the surrounding environment 130 and adjust the internal working parameters of the card.

Figure 2A:
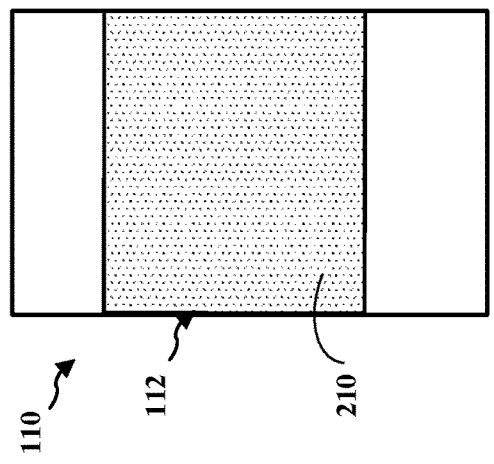
FIGS. 2A-2D are top, front, bottom, and right side views (with the left side view being identical to the right side view), respectively, of an example removable storage device in accordance with one or more techniques of this disclosure.
Figure 2B:
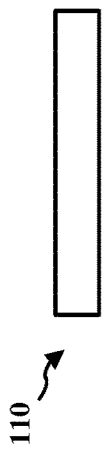
Figure 2C:
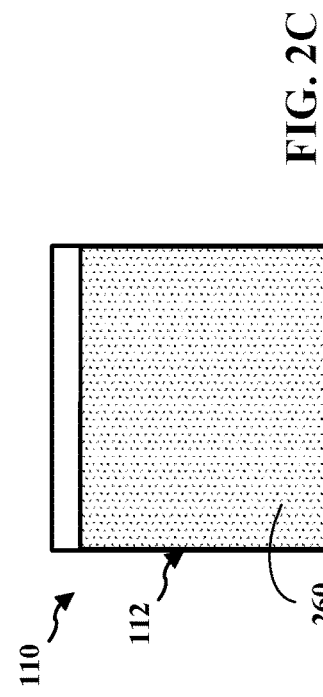
Figure 2D:
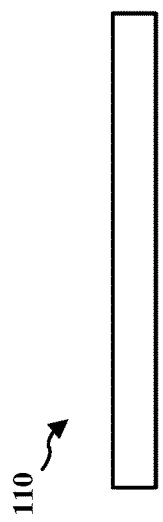

Referring to FIGS. 2A-2D, one example of the memory card or removable storage device 110 includes the memory card shell 112 having one or more thermally conductive elements, such as top surface memory card shell 210 in FIG. 2A or bottom surface memory card shell 260 in FIG. 2C. In some aspects, memory card shells 210, 260 can be a metallic or thermally conductive material. As shown in FIGS. 2A-2D, in some aspects, memory card shells 210, 260 can be on both the top and/or the bottom of the memory card 110 in order to more easily dissipate or transfer heat.

Additionally, memory card 110 can also include an input/output (I/O) pin 262 to receive the environment identification signal that includes the environment identification information 166 that identifies if the memory card 110 is located in the thermally enhanced environment 168 or the thermally non-enhanced environment 170.

Referring back to FIG. 1, memory card 110 can comprise a memory configured to store instructions. Memory card 110 can also comprise a processor 114 in communication with the memory 116. The processor 114 can be executable to identify an environment 130 around the memory card 110 as a thermally enhanced environment 168 or a thermally non-enhanced environment 170, such as in response to an initialization of operation of the memory card 110. In some aspects, the environment 130 can be immediately adjacent the memory card 110. The environment 130 can also be a space containing the memory card 110, as well as an enclosure having a thermally conductive element contacting the memory card. The processor 114 of memory card 110 can also adjust a thermal control algorithm, e.g., thermal control algorithm 174, based on the identified environment. The thermal control algorithm 174 can comprise a single algorithm with different parameters, or comprise multiple, different algorithms. Additionally, the processor 114 of memory card 110 can control processing operations of the processor 114, e.g., through operation control component 176, in response to the adjusted thermal control loop algorithm, e.g., thermal control algorithm 174. In some instances, the processor 114 can accept additional workload based on how much the workload is expected to raise the temperature of the memory card 110 relative to the threshold temperature. In a normal environment, e.g., thermally non-enhanced environment 170, thermal control algorithm 174 can predict a higher temperature per unit of work compared to thermal control algorithm 174 in an enhanced thermal environment, e.g., thermally enhanced environment 168.

In some aspects, the processor 114 of memory card 110 can select a first set of one or more control parameters for use in the thermal control algorithm 174, e.g., in response to an identification of thermally enhanced environment 168. Also, the processor 114 of memory card 110 can select a second set of one or more control parameters in the thermal control algorithm 174 in response to an identification of thermally non-enhanced environment 170. In some aspects, the thermal control algorithm 174 using the first set of one or more control parameters may result in a lower predicted temperature increase per unit of processing work by the processor 114 as compared to the thermal control algorithm 174 using the second set of one or more control parameters. Moreover, the present disclosure can include a plurality of different sets of control parameters, each of which can correspond to a different identified environment.

In other aspects, the processor 114 of memory card 110 can also select a first thermal control algorithm of thermal control algorithm 174 in response to an identification of thermally enhanced environment 168. Also, the processor 114 can select a second thermal control algorithm of thermal control algorithm 174 in response to an identification of a thermally non-enhanced environment 170. In some instances, the first thermal control algorithm of thermal control algorithm 174 may result in a lower predicted temperature increase per unit of processing work as compared to the second thermal control algorithm of thermal control algorithm 174. The present disclosure can include a plurality of different thermal control algorithms, each of which can correspond to a different identified environment.

Additionally, the processor 114 of memory card 110 can receive a processor work request, determine an expected temperature increase according to the thermal control algorithm 174, and/or identify a current temperature. The processor 114 can also compare a sum of the current temperature and the expected temperature increase to a thermal threshold. Further, the processor 114 can accept the processor work request in response to the sum being less than or equal to the thermal threshold. Moreover, the processor 114 can delay the processor work request in response to the sum being greater than the thermal threshold. The memory 116 of the memory card 110 can also comprise a non-volatile memory, e.g., NAND memory, comprising at least one of a processor temperature sensor 184 configured to detect a current temperature of the processor 114 and/or a memory temperature sensor 186 configured to detect a current temperature of the non-volatile memory. To determine the expected temperature increase, the processor 114 can be further configured to determine at least one of an expected processor temperature increase or an expected non-volatile memory temperature increase. To identify the current temperature, the processor 114 can be further configured to identify at least one of the current temperature of the processor 114 or the current temperature of the non-volatile memory, e.g., by using the processor temperature sensor 184 or the memory temperature sensor 186. Also, the thermal threshold can comprise at least one of a processor thermal threshold or a memory thermal threshold. To compare the sum to the thermal threshold, the processor 114 can be further configured to compare at least one of a first sum of the current temperature of the processor 114 and the expected processor temperature increase to the processor thermal threshold or to compare a second sum of the current temperature of the non-volatile memory and the expected non-volatile memory temperature increase to the memory thermal threshold. The processor 114 can be further configured to accept the processor work request in response to at least one of the first sum being less than or equal to the processor thermal threshold or the second sum being less than or equal to the memory thermal threshold. Further, the processor 114 can be configured to delay the processor work request in response to at least one of the first sum being greater than the processor thermal threshold or the second sum being greater than the memory thermal threshold.

In some aspects, the processor 114 can be further configured to detect, after the initialization, a change in the thermally enhanced environment. The processor 114 can also update the adjusted thermal control loop algorithm of the device based on the change in the thermally enhanced environment 168. Also, the processor 114 can control the processing operations of the processor in response to the updated thermal control algorithm 174. The processor 114 can also be configured to detect at least one of a fan in the thermally enhanced environment 168 being turned on, a fan in the thermally enhanced environment 168 being turned off, or a change in a heat dissipation rate of the thermally enhanced environment 168. As mentioned herein, the present disclosure can measure the performance of the memory card 110 over time and make corresponding adjustments in workload or rate. By doing so, the present disclosure can adaptively adjust the rate control of the memory card 110 based on its performance over time. Additionally, the present disclosure can adjust the workload or rate or the card based on the measured surrounding environment 130.

In some aspects, the memory card 110 can include at least one input/output (I/O) pin 262 in communication with the processor 114. The I/O pin 262 can be configured to receive, during the initialization, receive an environment identification signal that includes environment identification information 166 that indicates a type of the surrounding environment 130, such as a thermally enhanced environment 168 or a thermally non-enhanced environment 170. The memory card 110 can also include a housing within which the memory 116 and processor 114 are mounted, where the housing may comprise an external surface. The memory card 110 can also include a thermally conductive element, e.g., memory card shells 112, 210, 260, defining a part of or connected to the external surface of the housing, where the thermally conductive element can be configured to dissipate at least some heat from within the housing. Moreover, the I/O pin 262 can be in communication with the processor 114 and have an electrical path connecting with the thermally conductive element, e.g., memory card shells 112, 210, 260. The thermally conductive element may have a first position on the housing that aligns with a contact area of a thermal interface member of a host device 140 in response to the removable storage device 110 moving into a second position relative to the host device 140. The second position may also comprise an inserted position. Also, the processor 114 can be further configured to detect the initialization by determining whether the device is connected to a host device, e.g., host device 140. The host device 140 may include a structure that defines the environment around the device, e.g., surrounding environment 130. In some instances, a determination of being connected to the host device can indicate the initialization of the operation of the device, e.g., via initialization detection component 162.

As mentioned previously, memory cards according to the present disclosure can use multiple thermal algorithms, such as to govern card performance. For instance, a memory card 110 can change its thermal algorithm, e.g., thermal control algorithm 174, to reflect the thermal environment, e.g., environment 130, in which it is inserted. By doing so, if the card senses it is in a low performance environment, e.g., thermally non-enhanced environment 170, it can make certain thermal assumptions. Likewise, if the card senses it is in a high performance environment, e.g., thermally enhanced environment 168, it can determine the high performance environment and/or measure the exact environmental temperature. In some aspects, memory cards that are able to identify high performance environments and/or measure the surrounding environment can be referred to as high performance cards.

In addition to use in high thermal environments, memory card 110 can be designed to utilize the maximum or available thermal power range. In some aspects, the maximum thermal power range can be 2 W. In other aspects, the maximum thermal power range can be, for example, 3.88 W, but is not limited to this example value. Accordingly, memory card 110 can adjust its workload based on a designated maximum thermal power range. The maximum thermal power range can be any acceptable level. Memory card 110 can also create heat in a number of different ways. For instance, when memory is written, this can cause the NAND flash memory temperature of the memory card 110 to increase. Also, when memory is read, this can increase the ASIC temperature of the memory card 110, as well as the NAND temperature. In some aspects, it can be important for memory card 110 to not exceed the NAND critical temperature, as there are no guarantees regarding operation at or above this temperature. In some instances, the NAND critical temperature can be 70 degrees C. In other instances, the NAND critical temperature can be higher or lower than 70 degrees C. Memory card 110 can adjust its workload to reflect the temperature of the surrounding environment, e.g., environment 130. As such, performance algorithms, e.g., thermal control algorithm 174, of the memory card 110 can adjust the workload of the card based on the temperature of the surrounding environment, e.g., environment 130. As mentioned above, performance algorithms, e.g., thermal control algorithm 174, can also ensure that the NAND or ASIC critical temperature is not exceeded. These performance algorithms, e.g., thermal control algorithm 174, can also be drafted based on an expected NAND or ASIC critical temperature.

Memory card 110 can also perform work in bursts or short intervals of time, which can result in a bursts of heat being produced by the card. In some aspects, if memory card 110 recognizes that it is in thermally enhanced environment 168, the card can be more equipped to handle these workload bursts and the corresponding bursts in heat. Accordingly, by understanding the environment, e.g., environment 130, memory card 110 can better prepare for imminent workloads. In a thermally enhanced environment, e.g., thermally enhanced environment 168, the expected temperature of the memory card 110 can be lowered, as the temperature of the environment 130 is controlled. As the temperature variables are known in a thermally enhanced environment, e.g., thermally enhanced environment 168, memory card 110 may not need to make pessimistic assumptions regarding the temperature.

In some aspects, if the temperature of the environment is known, memory card 110 may be able to handle additional work, especially compared to not understanding the environment and/or making a pessimistic assumption regarding the temperature. This can be true even if the card temperature is close to the NAND or ASIC critical temperature. For instance, if memory card 110 is in a thermally enhanced environment, e.g., thermally enhanced environment 168, such that the card knows the exact temperature of the environment, the card can accept additional work, e.g., even if the temperature of the card is close to a critical or maximum temperature. Additionally, memory cards and thermally enhanced environments according to the present disclosure can work together to more efficiently dissipate the heat from the card. Therefore, memory card 110 can take on a larger amount of work once the card verifies it is in a thermally enhanced environment or verifies that the surrounding environment can support the card.

In some aspects, memory card 110 can gradually take on work to correspondingly increase in temperature up to a critical temperature. For example, cards can submit or receive memory work, and then measure the temperature to determine if the card can handle the work. This can continue until a card reaches a certain temperature, e.g., a critical or maximum temperature. However, when used in conjunction with a thermally enhanced environment, e.g., thermally enhanced environment 168, memory card 110 can understand the card temperature at all times, such that it is not necessary to measure the temperature of the environment. Further, memory card 110 can comprise different decay rates. For example, a card with an enhanced decay rate can mean that heat will dissipate faster compared to cards with a normal decay rate. In other aspects, memory card 110 can measure the temperature of the surrounding environment, e.g., environment 130, and save the measurements for use at a later date.

In some aspects, if memory card 110 is in a thermally enhanced environment, e.g., thermally enhanced environment 168, the card can measure the temperature and/or make assumptions regarding the temperature. Based on the measured or assumed temperature, memory card 110 can adjust one or more performance algorithms, e.g., thermal control algorithm 174, to adjust the workload of the card. For instance, memory card 110 can include an algorithm, e.g., thermal control algorithm 174, to adjust the workload of the card when the temperature of the card gets too close to the critical temperature. As such, memory card 110 can utilize algorithms, e.g., thermal control algorithm 174, to throttle the performance based on temperature. Additionally, memory card 110 can run firmware and/or include processor 114 in order to more thoroughly understand the temperature of the card and the surrounding environment, e.g., environment 130.

In an environment that is not thermally enhanced, e.g., thermally non-enhanced environment 170, memory card 110 may assume a certain temperature in an environment or actually measure the temperature. In a thermally enhanced environment, e.g., thermally enhanced environment 168, memory card 110 can be initialized or synchronized to the surrounding environment, e.g., environment 130. Once initialized or synchronized, the memory card 110 can receive an environment identification signal that includes environment identification information 166 that indicates a type of the surrounding environment 130, such as a thermally enhanced environment 168 or a thermally non-enhanced environment 170. As mentioned herein, thermally enhanced environment 168 can be a high performance environment that can regulate its own temperature and/or communicate with another device, e.g., memory card 110. For instance, thermally enhanced environment 168 can actively control the temperature of the environment, e.g., environment 130, such as by heating or cooling the environment. In contrast, an environment that is not thermally enhanced, e.g., thermally non-enhanced environment 170, may be a low performance environment that does not communicate with other devices and has no temperature control.

Referring to FIGS. 3A-3D, the card slot 120 (shown with memory card 110 inserted) may include one or more heat dissipation features in accordance with one or more techniques of this disclosure. As mentioned herein, in some aspects, memory card 110 can include a shell that can be a metallic or thermally conductive material in order to dissipate heat from the card. Card slot 120 can also comprise a metallic or thermally conductive material, e.g., copper, which can assist in dissipating heat from the card slot or memory card 110. As also shown in FIG. 1, card slot 120 can comprise connector base 122. Connector base 122 can also comprise a metallic or thermally conductive material in order to facilitate heat dissipation. In addition, card slot 120 can comprise connector tab 124, which can be used to mount the card slot 120 to another device. Card slot 120 can also comprise top opening 128 and card slot openings 316 that can help to dissipate heat away from the card slot 120 and/or memory card 110. As explained below, in aspects when memory card 110 is inserted in card slot 120, top opening 128 can align with a portion of memory card 110, e.g., memory card shell 112 or top surface memory card shell 210. Also, connector base 122 can comprise connector base openings 318 to dissipate heat away from card slot 120 and/or memory card 110.

Card slot 120 is an example of a feature in environments or host devices according to the present disclosure. As such, card slot 120 can regulate the amount of heat in the environment, e.g., environment 130, around the memory card 110. For instance, card slot 120 can remove heat from the environment either actively or indirectly. In some instances, card slot 120 can include a thermal path for heat dissipation, e.g., to dissipate heat from memory card 110. In these instances, the heat dissipation path can be a path from the memory card 110 to another component in the surrounding environment, e.g., card slot 120, connector base 122, and/or connector tab 124.

Figure 3D:
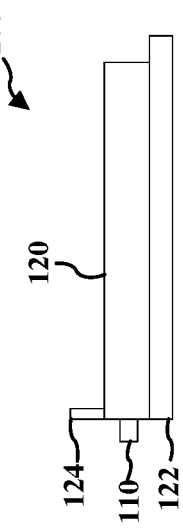
FIGS. 3A-3D are top, front, bottom, and right side views (with the left side view being a mirror image of the right side view), respectively, of the example removable storage device inserted within a card slot of a removable storage card interface in accordance with one or more techniques of this disclosure.
Figure 3A:
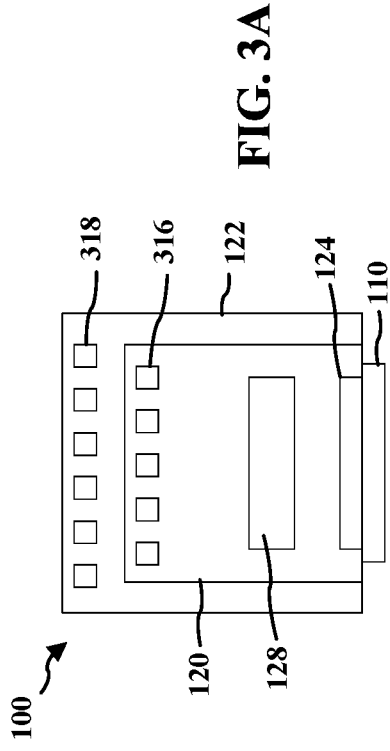
Figure 3B:
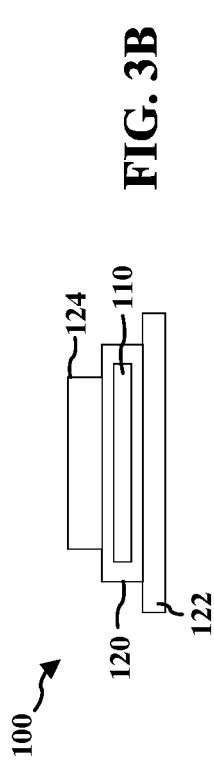
Figure 3C:
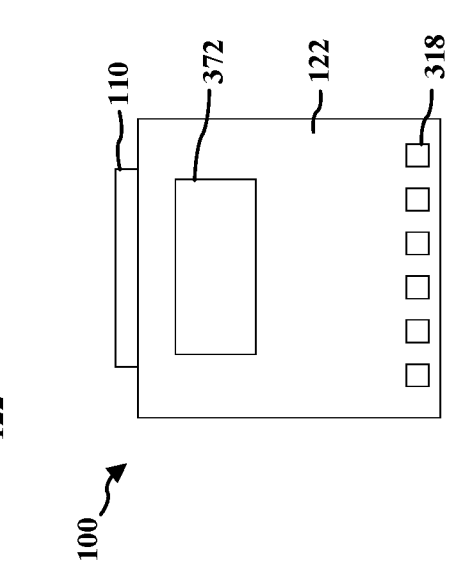

Referring specifically to FIG. 3C, card slot 120 may include, optionally or in addition, a heat spreader 372 connected to the connector base 122. Heat spreader 372 can also comprise a metallic or thermally conductive material in order to facilitate heat dissipation from the other components, e.g., card slot 120, connector base 122, connector tab 124, and/or memory card 110. As mentioned above, connector base 122 can also comprise connector base openings 318 to dissipate heat away from card slot 120, connector base 122, connector tab 124, and/or memory card 110.

As mentioned herein, in some aspects, card slot 120 can comprise materials which can facilitate heat dissipation. For example, in card slot 120, connector base 122, connector tab 124, and/or heat spreader 372 can comprise a thermal interface material or other thermally conductive material. As mentioned herein, card slot 120 can also include a thermal path emanating from one or more components. For example, in some aspects, there can be a thermal path leading away from card slot 120, connector base 122, and/or connector tab 124, such that it can assist with heat dissipation from these components and/or indirectly dissipate heat from memory card 110. Additionally, host device 140 can include a cooling device, e.g., a cooling fan near card slot 120, connector base 122, and/or connector tab 124, in order to directly cool these devices and/or indirectly cool memory card 110.

Referring back to FIG. 1, in some aspects, host device 140 can comprise a housing 180 having an internal wall defining a through hole 182. The housing 180 may include at least a removable memory card environment, e.g., environment 130, and a separate additional environment, e.g., other environment 150. Host device 140 can also comprise a removable memory card interface, e.g., card slot 120, mounted within the removable memory card environment, e.g., environment 130, and having a slot aligned with the through hole 182. Host device 140 can also include a removable storage card, e.g., memory card 110, removably positionable within the card slot 120 and contactable with a thermal interface member. The removable storage card, e.g., memory card 110, can include a processor, e.g., processor 114, executable to identify the removable memory card environment, e.g., environment 130, as a thermally enhanced environment, e.g., thermally enhanced environment 168, or a thermally non-enhanced environment, e.g., thermally non-enhanced environment 170, in response to an initialization of operation of the card. The processor 114 can also adjust a thermal control algorithm 174 of the memory card 110 based on the identified environment. Further, the processor 114 can control processing operations in response to the adjusted thermal control algorithm 174. Additionally, the host device 140 can comprise a chassis 188, as well as a thermal interface member positioned adjacent to the slot, e.g., card slot 120. In some instances, the removable memory card interface can be mounted to the chassis 188. Moreover, the thermally conductive element can be connected to the chassis 188.

As mentioned herein, in card slot 120, if memory card 110 the card is inserted in card slot 120, it can identify or determine if card slot 120 is a thermally enhanced environment. In some aspects, if card slot 120 is determined to be a thermally enhanced environment, e.g., thermally enhanced environment 168, then memory card 110 can adjust its workload accordingly. For instance, memory card 110 can select one of multiple performance algorithms, e.g., thermal control algorithm 174, based on whether card slot 120 is a thermally enhanced environment. Memory card 110 may select a high level performance algorithm if card slot 120 is in a thermally enhanced environment, e.g., thermally enhanced environment 168, or a low level performance algorithm, thermally non-enhanced environment 170, if card slot 120 is not in a thermally enhanced environment. As such, the type of thermal environment may result in memory card 110 performing at different levels. Therefore, memory card 110 can take on more work per unit of time when card slot 120 is identified as a thermally enhanced environment, e.g., thermally enhanced environment 168, such that memory card 110 can function at a higher power level and/or higher heat.

Aspects of the present disclosure can determine a thermally enhanced environment in a number of different ways. As mentioned herein, memory card 110 can include an I/O pin 262 to determine or identify if card slot 120 is a thermally enhanced environment. The I/O pin 262 can measure or identify if memory card 110 is inserted in card slot 120. Further, memory card 110 can receive a signal from card slot 120 or another component via the I/O pin 262, such that memory card 110 make a determination of the thermally enhanced status based on this signal. Additionally, memory card 110 can include other devices to identify the surrounding environment, e.g., environment 130, and/or measure the temperature of the surrounding environment, such as a thermal diode. In some aspects, the thermal diode may be present in another component of the card, e.g., a processor 114. In these aspects, the thermal diode can measure the heat of the processor 114, e.g., as part of processor temperature sensor 184, and/or measure the rate at which the card 110 is heating up. By doing so, the thermal diode can indirectly measure the temperature of the environment. In other aspects, the thermal diode can directly measure the NAND temperature or the ASIC temperature of the memory card 110. Also, card slot 120 can make the determination itself and directly inform memory card 110 of the thermally enhanced status of the environment. Moreover, memory card 110 can include a shell or case, e.g., shells 112, 210, 260, that can have the ability to measure or determine the environment in which the card is located.

The present disclosure can also include a variety of different implementations of memory cards and/or thermally enhanced environments. In one implementation, memory card 110 can include I/O pin 262 connected to a metallic thermal component, e.g., shells 112, 210, 260, in order to help dissipate heat from the card 110. The memory card 110 can also include processor 114 to measure the I/O pin 262 and determine if it is in contact with card slot 120 or other component. If the I/O pin 262 is not contacting a socket or card slot 120, it can be identified as floating or grounded. In these instances, the memory card 110 can measure the contact with the card slot 120 or other component by reading the I/O pin 262. Additionally, the I/O pin 262 can include a digital or analog input.

Aspects of the present disclosure can also include components comprising a thermal interface material, e.g., a card slot 120, connector base 122, connector tab 124, heat spreader 372, and/or chassis 188. In some aspects, once a component comprising the thermal interface material contacts the memory card 110, it can create a thermal path to dissipate heat away from the card. The thermal interface material can also be electrically conductive, and, in some instances, it can conduct in proportion to the thermal path. As the thermal interface material can be conductive, processor 114 of the memory card 110 can more easily determine if the card is in contact with another component, e.g., via initialization detection component 162.

As mentioned above, in some aspects, when memory card 110 contacts or is initialized with card slot 120 or other component, it can measure or determine the surrounding environment by reading the I/O pin 262. The memory card 110 can also measure the thermal path to determine a surrounding temperature by reading the I/O pin 262. If the pin 262 comprises a digital input, it can indicate if the surrounding environment is thermally enhanced or not thermally enhanced, such as by providing a contact or no contact indication. If the pin 262 comprises an analog input, it can indicate the level of thermal enhancement, e.g., by indicating the quality of the connection.

In some instances, once the contact level of the thermal path is measured, the measurement can be used to adjust the thermal control parameters, e.g., thermal control algorithm 174. If there is a no contact or low quality contact indication, then pessimistic thermal control values can be used to ensure the thermal limits are not exceeded. Otherwise, nominal control values may be used if a thermally enhanced environment is indicated. In some aspects, a new measurement may be performed periodically to update or adjust the parameters, e.g., thermal control algorithm 174. For example, host device 140 may activate a cooling device, e.g., a cooling fan, between measurements which can affect the quality of the thermal path, or the thermal interface material may succumb to heat degradation, each of which can affect the thermal parameters. As such, the thermal connection or path may adjust over time. A controller or processor in the surrounding environment, e.g., environment 130, can also inform the memory card 110 if the thermal environment has changed, in addition to informing the card of the thermally enhanced status of the environment. Further, if the surrounding environment has increased in temperature, then host device 140 may activate a cooling device or fan to reduce the temperature of the surrounding environment, e.g., environment 130.

In another aspect, a memory card 110 may use adaptive rate control for thermal management, which can allow for the adjustment of workload or temperature over time. Eventually, when using adaptive rate control, the card 110 can reach an optimal workload rate. In some instances, an adaptive rate control approach may take time to determine the temperature response of the surrounding environment, e.g., environment 130, and may not respond well to sudden changes in environment. In some aspects, the present disclosure can combine adaptive rate control with the aforementioned features in order to reduce or eliminate any drawbacks. For instance, it is possible to initialize a performance algorithm, e.g., thermal control algorithm 174, with a parameter based on any environmental measurements, which may to reduce any delays in start-up or adaptation time periods. Additionally, performing environmental measurements and updating the thermal parameters may reduce the adaptive rate control response time when the environment, e.g., environment 130, experiences changes in temperature.

In yet other aspects, system 100, host device 140, or environment 130 may inform the memory card 110 that it is in a thermally enhanced environment. This information may be static, i.e., known at the system 100, host device 140, or environment 130 based on design, or it can be derived by the system 100, host device 140, or environment 130 through measurements or other determinations. In some instances, the present disclosure may ensure a standard measurement is used so that the memory card 110 and system 100, host device 140, or environment 130 can agree on the performance of the thermal control parameters. In other instances, if the card thermal control parameters are updated periodically, then the system may perform periodic measurements and supply them to the card.

Figure 4B:
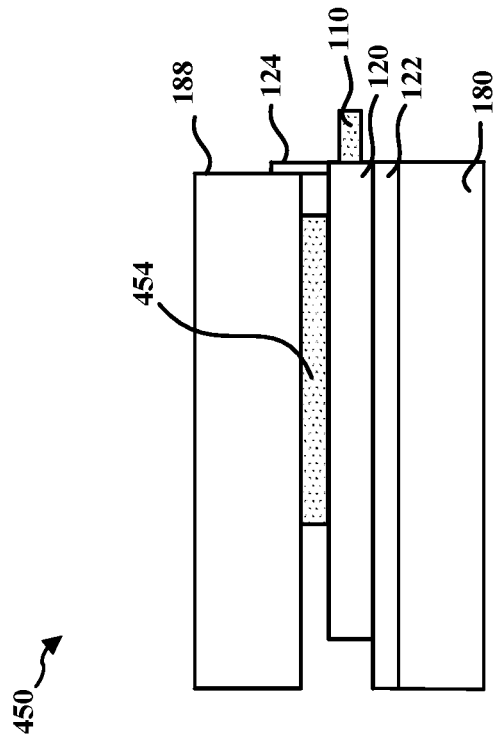
FIGS. 4A and 4B are schematic cut-away left side views of a host device including the example removable storage device inserted within the card slot of a removable storage card interface in accordance with one or more techniques of this disclosure.
Figure 4A:
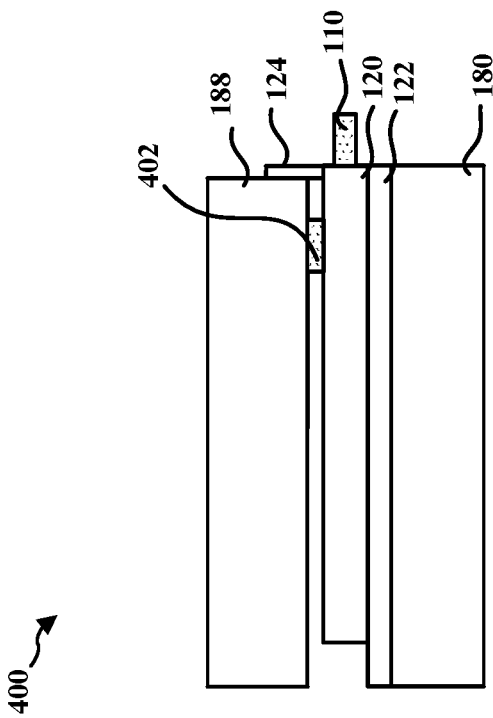

Referring to FIGS. 4A and 4B, host devices according to the present disclosure, e.g., host device 400 and host device 450, can include one or more embodiments or configurations. Host devices 400 and 450 may be the same as, or similar to, host device 140 (FIG. 1). The card slot 120 (shown with memory card 110 inserted) and connector base 122 may be between housing 180 and chassis 188. In some aspects, connector tab 124 can be mounted or attached to chassis 188, which may provide a thermal path to dissipate heat from the memory card 110.

Referring specifically to FIG. 4A, chassis 188 can include contact 402, such as tang or finger formed from an electrically and/or thermally conductive material, which can carry heat away from the memory card 110 and/or provide a signal to the memory card 110 of the presence of a thermally enhanced environment, e.g., immediately upon insertion. In some implementations, contact 402 may be located between the bottom of chassis 188 and card slot 120. In some aspects, contact 402 can align with top opening 128 of card slot 120, such that contact 402 can physically engage with a portion of the memory card 110 through the top opening 128. For example, contact 402 can removably connect with memory card shell 112 or top surface memory card shell 210 through the top opening 128. In some aspects, memory card 110 can also include a thermal slug, which may act as a relative large heat sink, on the top of the card and in touch with the contact 402 to enhance the dissipation of heat. As such, the thermally or electrically conductive properties of contact 402 improve heat dissipation of the memory card 110 and/or allow the memory card 110 to determine the type of environment in which it is inserted. For instance, by touching the contact 402 with card shell 112, 210 or the thermal slug, memory card 110 can determine whether the environment is thermally enhanced or thermally non-enhanced.

Referring specifically to FIG. 4B, host device 450 can also include thermal interface material (TIM) 454 to enhance heat dissipation from the memory card 110. In some implementations, TIM 454 can be positioned between the chassis 188 and the card slot 120. In some aspects, TIM 454 can contact the chassis 188 and align with top opening 128 of card slot 120. Similar to contact 402 mentioned above, TIM 454 can contact a portion of the memory card 110 through the top opening 128 to provide a thermal path for heat dissipation. For example, TIM 454 can contact memory card shell 112, 210 or a thermal slug on the card 110 through the top opening 128. TIM 454 can also be electrically conductive to enable signaling the type of environment to the memory card 110 immediately upon insertion into the card slot 120. In some aspects, if the chassis 188 is grounded and the TIM 454 is electrically conductive, e.g., in proportion to its thermal transport capability, then the card 110 can perform an analog measurement to understand the thermal path or thermal dissipation characteristics. Further, TIM 454 can also allow the memory card 110 to determine whether the environment is thermally enhanced or thermally non-enhanced, such as by contacting the card shell 112, 210 or a thermal slug.

Referring to FIG. 5, a graph 500 in accordance with one or more techniques of this disclosure relates to how the expected temperature of a memory card compared to a corresponding amount of work performed can change based on different environments. Graph 500 includes different curves corresponding to different environments of a memory card, e.g., curves or functions 502, 504, 506, 508, and 510. Function 502 displays a memory card performance when the memory card, e.g., memory card 110, is in a normal environment, e.g., thermally non-enhanced environment 170. Function 504 illustrates a memory card performance when the memory card, e.g., memory card 110, is in a thermally enhanced environment, e.g., thermally enhanced environment 168, with a thermal path leading away from the card. Function 506 shows a memory card performance when the memory card, e.g., memory card 110, is in a thermally enhanced environment, e.g., thermally enhanced environment 168, with a cooling device adjacent to the card, e.g., a fan. Function 508 displays a memory card performance when the memory card, e.g., memory card 110, is in a thermally enhanced environment, e.g., thermally enhanced environment 168, with a thermal path leading away from the card and a cooling device adjacent to the card, where the cooling device is on a low speed. Function 510 displays a memory card performance when the memory card, e.g., memory card 110, is in a thermally enhanced environment, e.g., thermally enhanced environment 168, with a thermal path leading away from the card and a cooling device adjacent to the card, where the cooling device is on a high speed.

Referring to FIG. 5, the thermal control component 172 may operate using the thermal control parameter(s) and/or algorithm(s) 174 may be adjusted to generate different curves or functions 502, 504, 506, 508, 510 of expected temperature change of a memory card, e.g., memory card 110, per unit work based on the type of environment in which it is inserted. For instance, based on the same amount of work performed, the expected temperature can change based on different environments. For example, function 510 may be used when a memory card, e.g., memory card 110, is inserted into a thermally enhanced environment 168, whereas function 502 can be used when a memory card is inserted into a thermally non-enhanced environment 170. For instance, function 510 can predict a lower expected temperature change of the card as compared to a normal environment. In some case, functions 510, 508, 506, and 504 may represent results from the thermal control parameter(s) and/or algorithm(s) 174 adjusted for different levels of thermally enhanced environment 168, e.g., including a fan, fan at different speeds, including other thermal dissipation components.

Figure 6B:
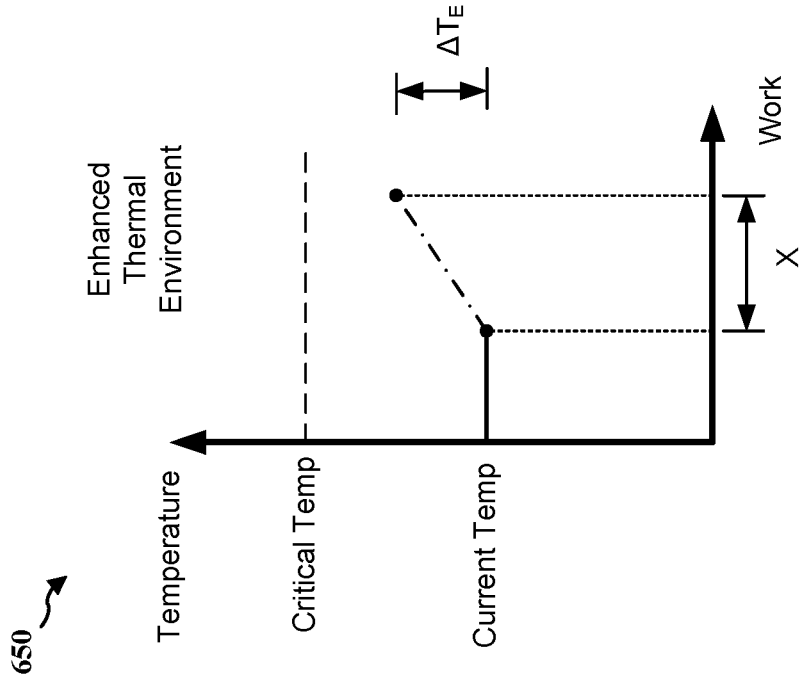
FIGS. 6A and 6B are graphs of temperature versus unit work for an example thermally non-enhanced environment and an example thermally enhanced environment, respectively, in examples of comparing an expected operating temperature (e.g., current temperature plus expected temperature change for a certain amount of work) to a critical temperature threshold, in accordance with one or more techniques of this disclosure.
Figure 6A:
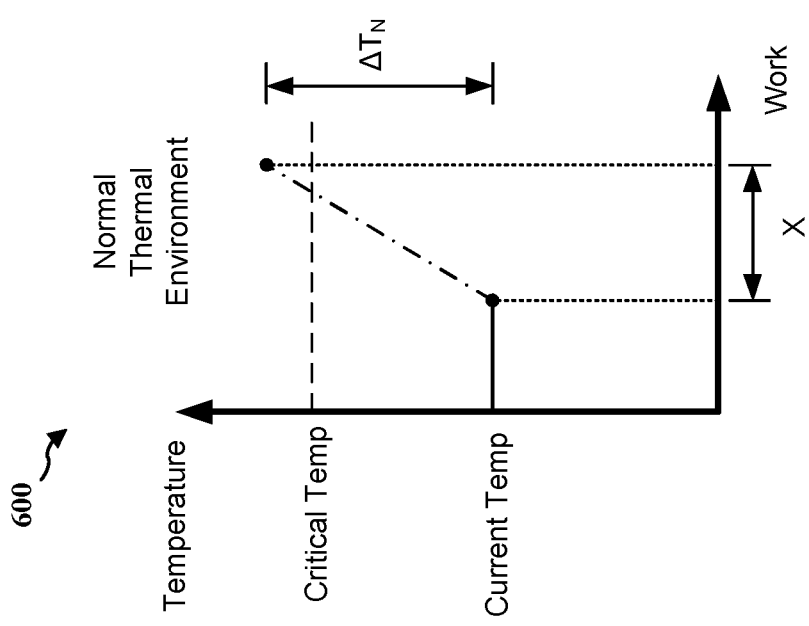

Referring to FIGS. 6A and 6B, example graphs 600 and 650 relate to comparisons performed by thermal control component 172 to determine if an amount of work is expected to increase temperature above a critical temperature in response to identifying the thermally non-enhanced environment 170 and the thermally enhanced environment 168, respectively, in accordance with one or more techniques of this disclosure. In these graphs, the thermal control component 172 uses different thermal control parameters and/or algorithms 174 to predict different expected temperature increases, and potentially different expected results relative to a critical temperature, for different surrounding environments, e.g., environment 130. FIG. 6A relates to the temperature of a memory card compared to the amount of work performed in a thermally non-enhanced environment, e.g., thermally non-enhanced environment 170. Graph 600 includes a current temperature of the card, a critical temperature of the card, an amount of work, X, and a difference in temperature, $\Delta T_N$.

FIG. 6B relates to the temperature of a memory card compared to the amount of work performed in a thermally enhanced environment, e.g., thermally enhanced environment 168. Graph 650 includes a current temperature of the card, a critical temperature of the card, an amount of work, X, and a difference in temperature, $\Delta T_E$. Graphs 600 and 650 both include a same work period, X, where the card is performing the same amount of work in both a normal and enhanced thermal environment. According to graph 600, after the amount of work, X, in a normal thermal environment, e.g., thermally non-enhanced environment 170, a card may exceed a critical temperature. In contrast, according to graph 650, after the same amount of work X in an enhanced thermal environment, e.g., thermally enhanced environment 168, a card may not exceed a critical temperature. Thus, based on the same amount of work, X, the critical temperature is exceed in a normal thermal environment, but not exceeded in an enhanced thermal environment. Accordingly, graphs 600 and 650 display that enhanced thermal environments, e.g., thermally enhanced environment 168, can help to control the temperature of memory cards, e.g., memory card 110.

Figure 7:
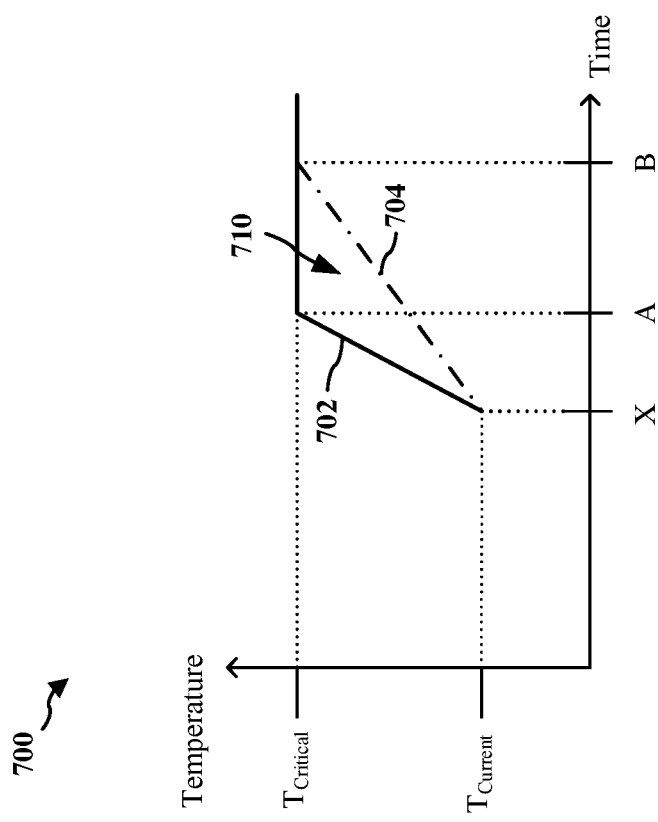
FIG. 7 is a graph of temperature versus time for performing work, in an example thermally non-enhanced environment and an example thermally enhanced environment, where the work raises a current operating temperature to a critical temperature threshold, in accordance with one or more techniques of this disclosure.

Referring to FIG. 7, example graph 700 relates the temperature to the time elapsed for the memory card 110 (FIG. 1) performing work in an example thermally enhanced environment 702 and in an example thermally non-enhanced environment 704. Both thermally enhanced environment 702 and thermally non-enhanced environment 704 start at a current operating temperature, $T_{current}$, and perform work until they reach a critical temperature threshold, $T_{critical}$. As shown in FIG. 7, the memory card 110 in thermally enhanced environment 702 can perform work at a faster rate than a memory card in thermally non-enhanced environment 704, as the card in thermally enhanced environment 702 can understand the precise temperature of surrounding the environment and correspondingly adjust a thermal control loop algorithm of the device based on the identified environment, and further control processing operations in response to the adjusted thermal control loop algorithm. For instance, the memory card 110 in thermally enhanced environment 702 can reach $T_{critical}$ at time A, while the memory card 110 in thermally non-enhanced environment 704 may not reach $T_{critical}$ until time B as it must work at a slower pace because it may not understand the surrounding environment.

Area 710 represents the work rate differential between the memory card 110 in thermally enhanced environment 702 and the memory card 110 in thermally non-enhanced environment 704. More specifically, the memory card 110 in thermally enhanced environment 702 can reach the critical temperature, $T_{critical}$, faster than a card in thermally non-enhanced environment 704, and then maintain a low level of work over time to keep the temperature just shy of the critical temperature. Accordingly, area 710 can represent that cards in thermally enhanced environment 702 can perform the same amount of work in a shorter time period as cards in thermally non-enhanced environment 704. Area 710 can also represent an amount of additional work that can be performed by the memory card 110 in thermally enhanced environment 702, as the memory card 110 can perform a low level of work once it has reached $T_{critical}$. As such, area 710 also represents that the memory card 110 in thermally enhanced environment 702 can perform additional work in the same time period compared to the memory card 110 in thermally non-enhanced environment 704. In other words, once the thermal equilibrium, e.g., just below $T_{critical}$, has been reached, the thermally enhanced environment 702 can allow for an amount of work to be performed at this temperature, as the heat created can be dissipated at an equivalent rate. In a thermally non-enhanced environment 704, however, the memory card 110 can assume that a certain amount of time should elapse for the card to cool, e.g., a unit of time that is greater than the assumption used in the thermally enhanced environment. As such, thermally enhanced environment 702 can allow the memory card 110 to shorten the time period to dissipate heat or cool off. In some aspects, the memory card 110 can wait for the temperature of the environment to decrease before accepting a new work request. Additionally, this wait time can depend on the type of environment in which memory card 110 is inserted, e.g., thermally enhanced environment 702 or thermally non-enhanced environment 704.

Figure 8:
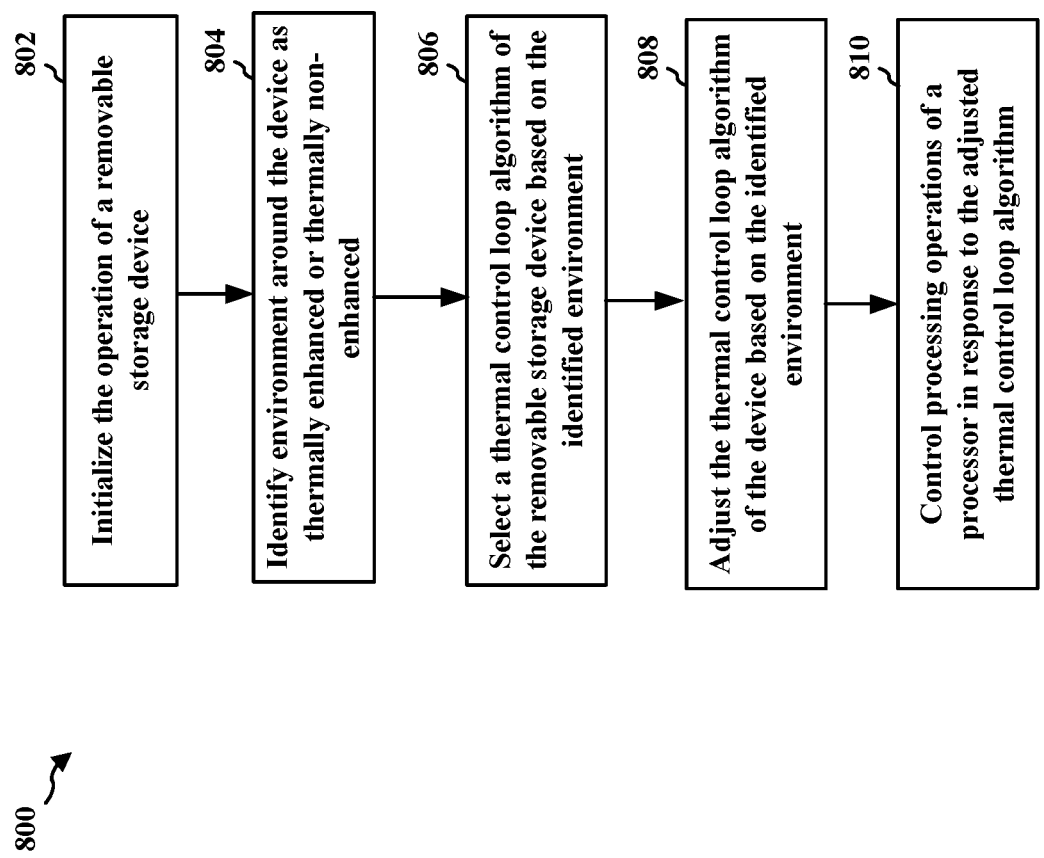
FIG. 8 is a flowchart of an example method in accordance with one or more techniques of this disclosure.

Referring to FIG. 8, an example method 800 in accordance with one or more techniques of this disclosure may be performed by a removable storage device or memory card 110 to adjust thermal control parameters/algorithms, e.g., thermal control algorithm 174, based on an identified type of a surrounding environment 130, e.g., thermally enhanced 168 or thermally non-enhanced 170.

At 802, the removable storage device may initialize the operation of a removable storage device, such as via connection with a socket or card slot of a host device, as described in connection with the examples in FIGS. 1, 2A-2D, 3A-3D, 4A, and 4B.

At 804, the removable storage device may identify an environment around the device as a thermally enhanced environment or a thermally non-enhanced environment in response to an initialization of operation of the device, as described in connection with FIGS. 1, 2A-2D, 3A-3D, 4A, and 4B.

At 806, the removable storage device may select a thermal control loop algorithm of the removable storage device based on the identified environment, as described in connection with the examples in FIGS. 1, 2A-2D, 3A-3D, 4A, and 4B. For instance, the device can select a first set of one or more control loop parameters for use in the thermal control algorithm in response to identification of the thermally enhanced environment, as described in connection with FIGS. 1, 2A-2D, 3A-3D, 4A, and 4B. The device can also select a second set of one or more control loop parameters in the thermal control algorithm in response to identification of the thermally non-enhanced environment, as described in connection with FIGS. 1, 2A-2D, 3A-3D, 4A, and 4B. The thermal control loop algorithm using the first set of one or more control loop parameters can result in a lower predicted temperature increase per unit of processing work by the processor as compared to the thermal control loop algorithm using the second set of one or more control loop parameters. Moreover, the device can select a first thermal control algorithm in response to an identification of the thermally enhanced environment, as described in connection with the examples in FIGS. 1, 2A-2D, 3A-3D, 4A, and 4B. The device can also select a second thermal control algorithm in response to an identification of the thermally non-enhanced environment, as described in connection with FIGS. 1, 2A-2D, 3A-3D, 4A, and 4B. The first thermal control loop algorithm can result in a lower predicted temperature increase per unit of processing work as compared to the second thermal control loop algorithm.

At 808, the removable storage device may adjust a thermal control loop algorithm of the device based on the identified environment, as described in connection with FIGS. 1, 2A-2D, 3A-3D, 4A, and 4B.

At 810, the removable storage device can control processing operations of a processor in response to the adjusted thermal control loop algorithm, as described in connection with the examples in FIGS. 1, 2A-2D, 3A-3D, 4A, and 4B.

Additionally, the removable storage device can receive a processor work request, determine an expected temperature increase according to the adjusted thermal control algorithm, and/or identify a current temperature, as described in connection with FIGS. 1, 2A-2D, 3A-3D, 4A, and 4B. The removable storage device can also compare a sum of the current temperature and the expected temperature increase to a thermal threshold, as described in connection with FIGS. 1, 2A-2D, 3A-3D, 4A, and 4B. The removable storage device can also accept the processor work request in response to the sum being less than or equal to the thermal threshold, as described in connection with FIGS. 1, 2A-2D, 3A-3D, 4A, and 4B. Further, the removable storage device can delay the processor work request in response to the sum being greater than the thermal threshold, as described in connection with FIGS. 1, 2A-2D, 3A-3D, 4A, and 4B.

The removable storage device can also detect a current temperature of the processor or a non-volatile memory, as described in connection with FIGS. 1, 2A-2D, 3A-3D, 4A, and 4B. In some instances, removable storage device can determine at least one of an expected processor temperature increase or an expected non-volatile memory temperature increase. The removable storage device can also identify at least one of the current temperature of the processor or the current temperature of the non-volatile memory, as described in connection with FIGS. 1, 2A-2D, 3A-3D, 4A, and 4B. Moreover, the thermal threshold comprises at least one of a processor thermal threshold or a memory thermal threshold. The removable storage device can also compare at least one of a first sum of the current temperature of the processor and the expected processor temperature increase to the processor thermal threshold or compare a second sum of the current temperature of the non-volatile memory and the expected non-volatile memory temperature increase to the memory thermal threshold. In some aspects, the processor can be further configured to accept the processor work request in response to at least one of the first sum being less than or equal to the processor thermal threshold or the second sum being less than or equal to the memory thermal threshold, as described in connection with FIGS. 1, 2A-2D, 3A-3D, 4A, and 4B. Further, the processor can be configured to delay the processor work request in response to at least one of the first sum being greater than the processor thermal threshold or the second sum being greater than the memory thermal threshold.

Additionally, the removable storage device can detect, after the initialization, a change in the thermally enhanced environment, as described in connection with FIGS. 1, 2A-2D, 3A-3D, 4A, and 4B. The removable storage device can also update the adjusted thermal control loop algorithm of the device based on the change in the thermally enhanced environment, as described in connection with the examples in FIGS. 1, 2A-2D, 3A-3D, 4A, and 4B. Further, the removable storage device can control the processing operations of the processor in response to the updated adjusted thermal control loop algorithm, as described in connection with FIGS. 1, 2A-2D, 3A-3D, 4A, and 4B.

In some aspects, the removable storage device can detect at least one of a fan in the thermally enhanced environment being turned on, a fan in the thermally enhanced environment being turned off, or a change in a heat dissipation rate of the thermally enhanced environment, as described in connection with FIGS. 1, 2A-2D, 3A-3D, 4A, and 4B. Also, the removable storage device may comprise at least one I/O pin in communication with the processor and configured to receive, during the initialization, an environment identification signal that identifies either the thermally enhanced environment or the thermally non-enhanced environment, as described in connection with FIGS. 1, 2A-2D, 3A-3D, 4A, and 4B. The removable storage device can further comprise a housing within which a memory and a processor are mounted, wherein the housing can have an external surface. The removable storage device can also comprise a thermally conductive element defining a part of or connected to the external surface of the housing, where the thermally conductive element can be configured to dissipate at least some heat from within the housing.

In yet other aspects, the removable storage device can comprise at least one I/O pin in communication with a processor and having an electrical path connecting with the thermally conductive element, as described in connection with FIGS. 1, 2A-2D, 3A-3D, 4A, and 4B. The I/O pin can be configured to receive via the electrical path, during the initialization, an environment identification signal that identifies either the thermally enhanced environment or the thermally non-enhanced environment. Moreover, the thermally conductive element can have a first position on the housing that aligns with a contact area of a thermal interface member of a host device in response to the removable storage device moving into a second position relative to the host device, where the second position may comprise an inserted position, as described in connection with FIGS. 1, 2A-2D, 3A-3D, 4A, and 4B. In addition, the removable storage device can detect the initialization by determining whether the device is connected to a host device, where the host device can include a structure that defines the environment around the device, and where a determination of being connected to the host device can indicate the initialization of the operation of the device, as described in connection with FIGS. 1, 2A-2D, 3A-3D, 4A, and 4B.

The subject matter described herein can be implemented to realize one or more benefits or advantages. For instance, the present disclosure can more accurately and efficiently predict the available workload of memory cards or removable storage devices. The described techniques can also be used by memory cards or removable storage devices to control the workload executed by a card. The present disclosure can also more accurately predict the temperature of a host device or memory card. The present disclosure can save time, effort, and costs by utilizing the aforementioned features of a memory card or host device.

Although various aspects are described herein, many variations and permutations of these aspects fall within the scope of this disclosure. Although some potential benefits and advantages of aspects of this disclosure are mentioned, the scope of this disclosure is not intended to be limited to particular benefits, uses, or objectives. Rather, aspects of this disclosure are intended to be broadly applicable to different removable storage technologies, some of which are illustrated by way of example in the figures and in the following description. The detailed description and drawings are merely illustrative of this disclosure rather than limiting, the scope of this disclosure being defined by the appended claims and equivalents thereof.

Several aspects are presented with reference to various apparatus and methods. These apparatus and methods are described in the following detailed description and illustrated in the accompanying drawings by various blocks, components, circuits, processes, algorithms, and the like, which can collectively be referred to as "elements." These elements may be implemented using electronic hardware, computer software, or any combination thereof. Whether such elements are implemented as hardware or software depends upon the particular application and design constraints imposed on the overall system.

Throughout this disclosure, the preferred embodiment and examples illustrated should be considered as exemplars, rather than as limitations on the present disclosure. As used herein, the term "invention," "device," "apparatus," "method," "disclosure," "present invention," "present device," "present apparatus," "present method," or "present disclosure" refers to any one of the embodiments of the disclosure described herein, and any equivalents. Furthermore, reference to various feature(s) of the "invention," "device," "apparatus," "method," "present invention," "present device," "present apparatus," or "present method" throughout this document does not mean that all claimed embodiments or methods must include the referenced feature(s).

When an element or feature is referred to as being "on" or "adjacent" to another element or feature, it can be directly on or adjacent the other element or feature or intervening elements or features may also be present. In contrast, when an element is referred to as being "directly on" or extending "directly onto" another element, there are no intervening elements present. Additionally, when an element is referred to as being "connected" or "coupled to" another element, it can be directly connected or coupled to the other element or intervening elements may be present. In contrast, when an element is referred to as being "directly connected" or "directly coupled" to another element, there are no intervening elements present.

Additionally, relative terms such as "inner," "outer," "upper," "top," "above," "lower," "bottom," "beneath," "below," and similar terms, may be used herein to describe a relationship of one element to another. Terms such as "higher," "lower," "wider," "narrower," and similar terms, may be used herein to describe angular relationships. These terms are intended to encompass different orientations of the elements or system in addition to the orientation depicted in the figures.

Although the terms first, second, third, etc., may be used herein to describe various elements, components, regions, and/or sections, these elements, components, regions, and/or sections should not be limited by these terms. These terms are only used to distinguish one element, component, region, or section from another. Thus, unless expressly stated otherwise, a first element, component, region, or section discussed below could be termed a second element, component, region, or section without departing from the teachings of the present disclosure. As used herein, the term "and/or" includes any and all combinations of one or more of the associated list items.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. For example, when the present specification refers to "an assembly," this language encompasses a single assembly or a plurality or array of assemblies. Further, the terms "comprises," "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

For clarity, only certain selected aspects of the software-based implementations are described. Other details that are well known in the art are omitted. For example, the disclosed technology is not limited to any specific computer language or program. For instance, the disclosed technology can be implemented by software written in a suitable programming language, e.g., C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable including fiber optic cable, magnetic communications, electromagnetic communications, e.g., RF, microwave, and infrared communications, electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present or problems be solved.

The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology. Rather, the scope of the disclosed technology includes what is covered by the following claims. We therefore claim all that comes within the scope and spirit of the claims.

In accordance with this disclosure, the term "or" may be interpreted as "and/or" where context does not dictate otherwise. Additionally, while phrases such as "one or more" or "at least one" or the like may have been used for some features disclosed herein but not others; the features for which such language was not used may be interpreted to have such a meaning implied where context does not dictate otherwise.

In one or more examples, the functions described herein may be implemented in hardware, software, firmware, or any combination thereof. For example, although the term "processing unit" has been used throughout this disclosure, such processing units may be implemented in hardware, software, firmware, or any combination thereof. If any function, processing unit, technique described herein, or other module is implemented in software, the function, processing unit, technique described herein, or other module may be stored on or transmitted over as one or more instructions or code on a computer-readable medium. Computer-readable media may include computer data storage media or communication media including any medium that facilitates transfer of a computer program from one place to another. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. By way of example, and not limitation, such computer-readable media can comprise RAM, ROM, EEPROM, CD-ROM or other optical disk storage, magnetic disk storage or other magnetic storage devices. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media. A computer program product may include a computer-readable medium.

The code may be executed by one or more processors, such as one or more digital signal processors (DSPs), general purpose microprocessors, application specific integrated circuits (ASICs), arithmetic logic units (ALUs), field programmable logic arrays (FPGAs), or other equivalent integrated or discrete logic circuitry. Accordingly, the term "processor," as used herein may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs, e.g., a chip set. Various components, modules or units are described in this disclosure to emphasize functional aspects of devices configured to perform the disclosed techniques, but do not necessarily require realization by different hardware units. Rather, as described above, various units may be combined in any hardware unit or provided by a collection of interoperative hardware units, including one or more processors as described above, in conjunction with suitable software and/or firmware.

Various examples have been described. These and other examples are within the scope of the following claims.

What is claimed is:

1. A removable storage device, comprising:
   a memory configured to store data; and
   a processor in communication with the memory and executable to:
   identify an environment around the removable storage device as a thermally enhanced environment or a thermally non-enhanced environment in response to an initialization of operation of the removable storage device;
   adjust a thermal control loop algorithm of the removable storage device based on the environment to reduce a predicted temperature increase per unit of processing work by the processor in response to the thermally enhanced environment being identified; and
   control processing operations of the processor in response to the thermal control loop algorithm.

2. The removable storage device of claim 1, wherein to adjust the thermal control loop algorithm, the processor is configured to:
   select a first set of one or more control loop parameters for use in the thermal control loop algorithm in response to identification of the thermally enhanced environment; and
   select a second set of one or more control loop parameters in the thermal control loop algorithm in response to identification of the thermally non-enhanced environment;
   wherein the thermal control loop algorithm using the first set of one or more control loop parameters lowers the predicted temperature increase per unit of processing work by the processor as compared to the thermal control loop algorithm using the second set of one or more control loop parameters.

3. The removable storage device of claim 1, wherein the thermal control loop algorithm is a first thermal control loop algorithm, and to adjust the thermal control loop algorithm, the processor is configured to:
   select a second thermal control loop algorithm in response to identification of the thermally enhanced environment; and
   select a third thermal control loop algorithm in response to identification of the thermally non-enhanced environment;
   wherein the second thermal control loop algorithm lowers the predicted temperature increase per unit of processing work as compared to the third thermal control loop algorithm.

4. The removable storage device of claim 1, wherein to control processing operations of the processor, the processor is further configured to:
   receive a processor work request;
   determine an expected temperature increase according to the thermal control loop algorithm;
   identify a current temperature;
   compare a sum of the current temperature and the expected temperature increase to a thermal threshold;
   accept the processor work request in response to the sum being less than or equal to the thermal threshold; and
   delay the processor work request in response to the sum being greater than the thermal threshold.

5. The removable storage device of claim 4, wherein the memory comprises a non-volatile memory, and further comprising:
   at least one of a processor temperature sensor configured to detect a current temperature of the processor or a memory temperature sensor configured to detect a current temperature of the non-volatile memory;
   wherein to determine the expected temperature increase, the processor is further configured to determine at least one of an expected processor temperature increase or an expected non-volatile memory temperature increase;
   wherein to identify the current temperature, the processor is further configured to identify at least one of the current temperature of the processor or the current temperature of the non-volatile memory;
   wherein the thermal threshold comprises at least one of a processor thermal threshold or a memory thermal threshold;
   wherein to compare the sum to the thermal threshold, the processor is further configured to compare at least one of a first sum of the current temperature of the processor and the expected processor temperature increase to the processor thermal threshold or to compare a second sum of the current temperature of the non-volatile memory and the expected non-volatile memory temperature increase to the memory thermal threshold;

wherein the processor is further configured to accept the processor work request in response to at least one of the first sum being less than or equal to the processor thermal threshold or the second sum being less than or equal to the memory thermal threshold; and wherein the processor is further configured to delay the processor work request in response to at least one of the first sum being greater than the processor thermal threshold or the second sum being greater than the memory thermal threshold.

6. The removable storage device of claim 1, wherein the processor is further configured to:

detect, after the initialization, a change in the thermally enhanced environment;

generate an updated thermal control loop algorithm by updating the thermal control loop algorithm of the removable storage device based on the change in the thermally enhanced environment; and control the processing operations of the processor in response to the updated thermal control loop algorithm.

7. The removable storage device of claim 6, wherein to detect the change in the thermally enhanced environment, the processor is further configured to detect at least one of:

a cooling device in the thermally enhanced environment being turned on;

a cooling device in the thermally enhanced environment being turned off; or a change in a heat dissipation rate of the thermally enhanced environment.

8. The removable storage device of claim 1, further comprising at least one input/output (I/O) pin in communication with the processor and configured to receive, during the initialization, an environment identification signal that identifies either the thermally enhanced environment or the thermally non-enhanced environment.

9. The removable storage device of claim 1, further comprising:

a housing within which the memory and processor are mounted, the housing having an external surface; and a thermally conductive element defining a part of or connected to the external surface of the housing, wherein the thermally conductive element is configured to dissipate at least some heat from within the housing.

10. The removable storage device of claim 9, further comprising:

at least one input/output (I/O) pin in communication with the processor and having an electrical path connecting with the thermally conductive element, wherein the I/O pin is configured to receive via the electrical path, during the initialization, an environment identification signal that identifies either the thermally enhanced environment or the thermally non-enhanced environment.

11. The removable storage device of claim 9, wherein the thermally conductive element has a first position on the housing that aligns with a contact area of a thermal interface member of a host device in response to the removable storage device moving into a second position relative to the host device, wherein the second position comprises an inserted position.

12. The removable storage device of claim 1, wherein the processor is further configured to detect the initialization by determining whether the removable storage device is connected to a host device, wherein the host device includes a structure that defines the environment around the device, and wherein a determination of being connected to the host device indicates the initialization of the operation of the removable storage device.

13. A host device, comprising:

a removable memory card interface mounted within a removable memory card environment; and a removable storage card removably positionable within a slot and contactable with a thermal interface member, wherein the removable storage card includes a processor executable to:

identify the removable memory card environment as a thermally enhanced environment or a thermally non-enhanced environment in response to an initialization of operation of the card;

adjust a thermal control loop algorithm of the card based on the environment to reduce a predicted temperature increase per unit of processing work by the processor in response to the thermally-enhanced environment being identified; and control processing operations of the processor in response to the thermal control loop algorithm.

14. The host device of claim 13, further comprising:

a housing having an internal wall defining a through hole, wherein the housing includes at least the removable memory card environment and a separate additional component environment;

wherein the removable memory card interface includes the slot aligned with the through hole;

a chassis;

a thermal interface member positioned adjacent to the slot;

wherein the removable memory card interface is mounted to the chassis; and wherein the thermally conductive element is connected to the chassis.

15. The host device of claim 13, wherein the host device informs the removable storage card whether the removable memory card environment is a thermally enhanced environment or a thermally non-enhanced environment.

16. The host device of claim 13, wherein the removable storage card reports one or more preferred thermal parameters to the host device, wherein the host device determines an amount of thermally enhanced environment or a thermally non-enhanced environment the removable storage card utilizes.

17. The host device of claim 13, wherein the removable storage card reports one or more preferred card thermal parameters to the host device, wherein the host device updates one or more host thermal control loop parameters based on the preferred card thermal parameters.

18. A method of operation of a removable storage device, comprising:

identifying an environment around the removable storage device as a thermally enhanced environment or a thermally non-enhanced environment in response to an initialization of operation of the device;

adjusting a thermal control loop algorithm of the removable storage device based on the environment; and controlling processing operations of a processor in response to the thermal control loop algorithm, wherein controlling processing operations comprises:

determining an expected temperature increase according to the thermal control loop algorithm; and accepting or denying a processor work request based on the expected temperature increase and a current temperature.

19. The method of claim 18, wherein adjusting the thermal control loop algorithm comprises:
   selecting a first set of one or more control loop parameters for use in the thermal control loop algorithm in response to identification of the thermally enhanced environment; and
   selecting a second set of one or more control loop parameters in the thermal control loop algorithm in response to identification of the thermally non-enhanced environment;
   wherein the thermal control loop algorithm using the first set of one or more control loop parameters results in a lower predicted temperature increase per unit of processing work by the processor as compared to the thermal control loop algorithm using the second set of one or more control loop parameters.

20. The method of claim 18, wherein the thermal control loop algorithm is a first thermal control loop algorithm, and adjusting the thermal control loop algorithm comprises:
   selecting a second thermal control loop algorithm in response to identification of the thermally enhanced environment; and
   selecting a third thermal control loop algorithm in response to identification of the thermally non-enhanced environment;
   wherein the second thermal control loop algorithm results in a lower predicted temperature increase per unit of processing work as compared to the third thermal control loop algorithm.

* * * * *